(12) United States Patent
Chugh et al.

(10) Patent No.: US 7,900,168 B2
(45) Date of Patent: Mar. 1, 2011

(54) CUSTOMIZABLE SYNTHESIS OF TUNABLE PARAMETERS FOR CODE GENERATION

(75) Inventors: Mukesh K. Chugh, Natick, MA (US); Brian K. Ogilvie, Holliston, MA (US)

(73) Assignee: The MathWorks, Inc., Natick, MA (US)

( * ) Notice: Subject to any disclaimer, the term of this patent is extended or adjusted under 35 U.S.C. 154(b) by 551 days.

(21) Appl. No.: 11/776,891

(22) Filed: Jul. 12, 2007

(65) Prior Publication Data
US 2009/0019416 A1   Jan. 15, 2009

(51) Int. Cl.
*G06F 17/50* (2006.01)
(52) U.S. Cl. .................. 716/18; 716/1; 716/2; 716/6
(58) Field of Classification Search ............. 716/1, 716/2, 6, 18
See application file for complete search history.

(56) References Cited

U.S. PATENT DOCUMENTS

| | | | |
|---|---|---|---|
| 6,219,628 B1 | 4/2001 | Kodosky et al. | |
| 6,668,312 B2 * | 12/2003 | Aubury | 711/170 |
| 6,745,264 B1 | 6/2004 | Luke et al. | |
| 7,676,649 B2 * | 3/2010 | Rapp et al. | 712/43 |
| 2003/0107595 A1 | 6/2003 | Ciolfi | |
| 2004/0148151 A1 | 7/2004 | Menter et al. | |
| 2005/0278682 A1 | 12/2005 | Dowling | |
| 2006/0064669 A1 | 3/2006 | Ogilvie et al. | |
| 2006/0064670 A1 | 3/2006 | Linebarger et al. | |
| 2006/0140501 A1 | 6/2006 | Tadas | |
| 2008/0222580 A1 * | 9/2008 | Banerjee et al. | 716/4 |

OTHER PUBLICATIONS

Lucas, Amilcar do Carmo, et al., "FlexWAFE—A High-end Real-Time Stream Processing Library for FPGAs," Design Automation Conference, 2007. DAC '07. 44th ACM/IEEE, IEEE, PI, Jun. 1, 2007, pp. 1-6.
"Notification of Transmittal of the International Search Report and the Written Opinion of the International Searching Authority, or the Declaration," International Filing Date: Jul. 10, 2008, International Application No. PCT/US2008/008448, Applicant: The Mathworks, Inc., Date of Mailing: Dec. 18, 2008, pp. 1-15.

* cited by examiner

*Primary Examiner*—Thuan Do
(74) *Attorney, Agent, or Firm*—Cesari and McKenna, LLP; Michael R. Reinemann (57) ABSTRACT

An apparatus, method and/or computer readable media automatically generate hardware description language (HDL) code. A design environment is configured to receive a hardware design, the hardware design including a plurality of numerical parameters. A user interface (UI) accepts a designation of a first numerical parameter as a tunable numerical parameter. An HDL code generator detects the designation and instantiates a memory structure to store the first numerical parameter. The HDL code generator also configures an interface of a module of the hardware design to receive a value of the first numerical parameter, and instantiates one or more structures internal to the module to utilize the first numerical parameter. The HDL code generator also determines a second numerical parameter has not been designated as a tunable numerical parameter, in response, instantiates one or more structures to maintain the second numerical parameter as a hard-coded numerical parameter.

44 Claims, 9 Drawing Sheets

CUSTOMIZABLE SYNTHESIS OF TUNABLE PARAMETERS FOR CODE GENERATION

BACKGROUND

1. Field of the Invention

The present disclosure relates generally to code generation, and more specifically to hardware description language (HDL) code generation.

2. Background Information

The use of HDLs to describe electronic hardware has become increasingly widespread. An HDL is a language that includes expressions for describing the temporal behavior, as well as the spatial structure (e.g., circuit connectivity) of hardware. In contrast to most "software" programming languages, such as C, C++, Java and others, an HDL's syntax and semantics generally includes explicit notations for expressing time and concurrency, as they are often important attributes of hardware devices.

Popular HDLs include Verilog, which was originally introduced by Gateway Design Automation and has been most recently standardized under IEEE Std. 1800-2005 and Very High Speed Integrated Circuit Hardware (VHSIC) Description Language (VHDL) most recently standardized under IEEE Std. 1076-2000. In addition, other popular languages, such as SystemVerilog standardized under IEEE Std. 1800-2005 and a synthesizable subset of SystemC, most recently standardized under IEEE Std. 1666-2005, implement HDL-like functionality and may in a general sense be considered HDLs. HDL code may be structured at a number of different levels. Commonly, HDL code is structured at the Register Transfer Level (RTL), a level that combines behavioral and dataflow constructs to describe a hardware device. RTL HDL code may be used to define modules. The modules may then be provided to a synthesis tool and synthesized into a gate-level netlist, which is a description of a circuit in terms of logic gates and the connections between gates. The gate-level netlist may then be provided to an automated place-and-route routine that creates a layout for the hardware device. Such a layout may be used to create an application specific integrated circuit (ASIC), or to configure a field programmable gate array (FPGA) or Programmable Array Logic (PAL), or to implement and/or configure another type of hardware device.

Although HDLs provide a proven technique for hardware design, the task of specifying hardware with an HDL is generally difficult and labor intensive. As such, the mechanics of low-level HDL coding often consumes a significant amount of development time.

In part to relieve a designer from the burdens of manual HDL coding, some computing environments allow a designer to write code in a higher level text or graphical programming language, and then generate HDL modules there from. For example, the MATLAB® technical computing environment (TCE) available from The MathWorks, Inc. of Natick, Mass. allows a designer to describe the functionality of certain hardware devices, for example digital filters, and to automatically generate HDL modules, such as Verilog and/or VHDL modules, therefrom. The MATLAB® TCE further may be used to generate appropriate test benches for simulating, testing, and verifying the generated HDL modules.

A Simulink® TCE, also available from The Mathworks, Inc., and includes functionality that allows the designer to build a model using graphical programming techniques, for example by dragging and dropping blocks from a library into a graphical editor and connecting them with lines that establish relationships between the blocks. Thereafter, the designer may automatically generate HDL modules, such as Verilog and/or VHDL modules therefrom. Similarly, test benches for use with the generated HDL modules may also be generated. In this manner, low-level manual HDL coding may often be avoided.

In some circumstance, the full advantages of automatic HDL code generation may not be fully realized, as one must still modify and/or add to the generated HDL code to ensure certain features are implemented in a desired manner. For example, an issue often occurs when numerical parameters are implemented in a design. Often such numerical parameters are automatically "hard-coded" into the generated HDL modules. That is, the numerical parameters are simply defined in the HDL code using a data type associated with constants, such as the parameter or localparameter constructs in Verilog, or the constant construct in VHDL. Hard-coding parameters may lead to simple and efficient hardware, yet provide little flexibility for later adjustments and dynamic changes to the numerical parameters.

Sometimes a designer may desire for certain numerical parameters to not be hard-coded into HDL modules. This may require a designer to delve into the HDL code, and manually code additional features needed to implement such a design. The need for manual HDL coding requires the designer to be proficient in HDL programming. In addition, the need for manual HDL coding may consume significant development time.

Accordingly, improved techniques are needed.

SUMMARY

In an example embodiment, a technical computing environment (TCE) includes a design environment that receives a hardware design. The hardware design may be defined by a number of design parameters, and at least some of the design parameters may be numerical parameters. A user interface (UI) of the TCE allows a user to indicate certain numerical parameters as "tunable numerical parameters," that is, as numerical parameters that should be handled in a special way so that their values may be set, adjusted, and/or dynamically changed in the hardware design. For a tunable parameter, a code generator of the TCE instantiates and configures structures in the HDL to permit the values of the numerical parameters to be tunable. Other numerical parameters that are not tunable numerical parameters may be implemented in a hard-coded manner. By strategically selecting some numerical parameters as tunable numerical parameters, while allowing others to be hard-coded, a user may control how a design is implemented. Advantageously, this control is achieved without manual HDL coding.

More specifically, in response to a particular numerical parameter being designated as a tunable numerical parameter, the HDL code generator may instantiate in HDL code a memory structure for storing the numerical parameter. The memory structure may be located internal to a module that utilizes the numerical parameter. The HDL code generator may configure an interface of the module to have a port to receive a signal with a value for the numerical parameter, and to pass the signal on to the memory structure. The interface may also be configured to have other ports for receiving control signals and/or other types of signals used by the memory structure. Further, the code generator may instantiate in HDL code certain structures internal to the module to utilize the tunable numerical parameter. These structures may include additional and/or different hardware needed to utilize the tunable numerical parameter and to generate appropriate control and/or other types of signals.

BRIEF DESCRIPTION OF THE DRAWINGS

The description below refers to the accompanying drawings, of which.

DETAILED DESCRIPTION OF AN ILLUSTRATIVE EMBODIMENT

Figure 1:
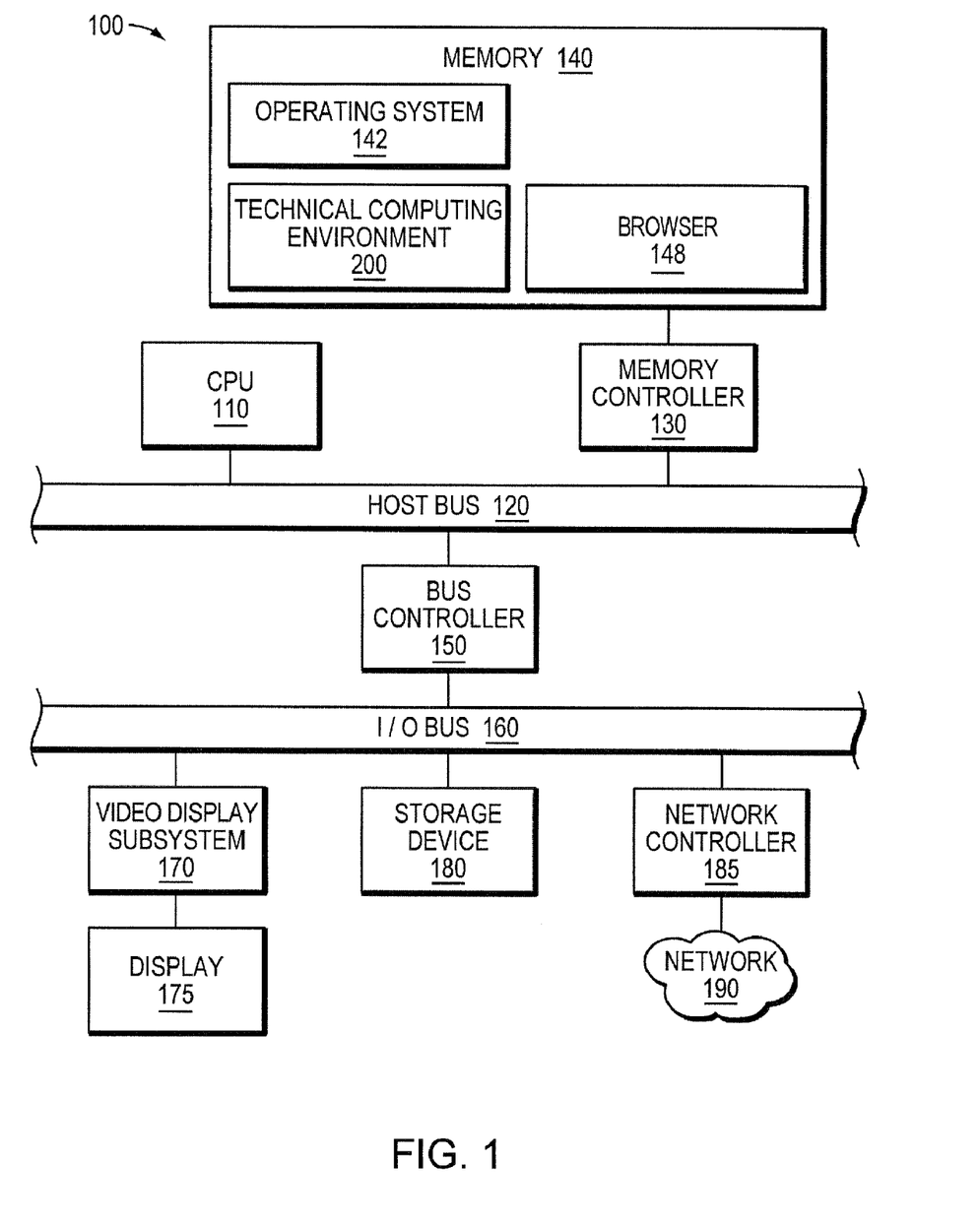
FIG. 1 is a high-level schematic block diagram of an example computer system that may be used with some embodiments of the present disclosure.

FIG. 1 is a high-level schematic block diagram of an example computer system 100 that may be used with some embodiments of the present disclosure. The computer system 100 includes at least one central processing unit (CPU) 110 coupled to a host bus 120. The CPU 110 may be any of a variety of commercially available processors, such as an Intel x86 single-core processor, an Intel dual-core processor, an IBM PowerPC processor, a Sun SPARC processor, or another type of processor (e.g., a reduced instruction set processor). A memory 140, such as a Random Access Memory (RAM), is coupled to the host bus 120 via a memory controller 130. The memory 140 may be adapted to store at least a portion of an operating system 142 while the computer system 100 is operating. The memory 140 is further adapted to store at least portions of certain application software executing on the computer system 100. The application software may include a web-browser 148 as well as a technical computing environment (TCE) 300.

A TCE, such as 300, is generally an environment that allows a user to perform a variety of tasks, for example tasks relating to data analysis, algorithm generation, modeling, simulation, test and measurement, control, visualization, image processing, application development, and/or other tasks. It may be used in the fields of mathematics, science, engineering, medicine, business, as well as in other fields. Further, it may provide mechanisms for text-based programming, graphical programming, a hybrid of text and graphical programming, or some other type of programming.

In one embodiment, the TCE 300 corresponds to the MATLAB® technical computing environment available from The MathWorks, Inc. of Natick, Mass. The MATLAB® TCE is a dynamically typed largely text-based programming environment that, among other things, provides matrix and/or vector formulations for storing and manipulating data. Further, through dynamic typing, the environment may obviate certain low-level administrative tasks, such as declaring variables, specifying data types, and allocating memory. Alternately, rather than being the MATLAB® TCE, the TCE 300 may be another text-based programming environment, for example the LabVIEW® MathScript textual programming system available from National Instruments Corp. of Austin, Tex. environment, the Mathematica™ environment available from Wolfram Research, Inc. of Champaign, Ill., or another environment.

In another embodiment, the TCE 300 may be the Simulink® TCE, also available from The MathWorks, Inc. The Simulink® TCE is a largely graphical programming environment that allows users to construct a model using graphical programming techniques, for example by dragging and dropping blocks from a library into a graphical editor and connecting them with lines that establish relationships between the blocks. Alternately, rather than being the Simulink® TCE, the TCE may be another type of graphical programming environment such as the LabVIEW® development system available from National Instruments Corp. of Austin, Tex., the Agilent VEE® graphical language available from Agilent Technologies Inc. of Santa Clara, Calif., or another type of graphical programming environment.

In yet another embodiment, the TCE 300 may be a hybrid programming environment incorporating text-based, graphical and or other types of programming constructs. Accordingly, TCE 330 should be interpreted broadly and not limited to a particular programming environment.

As discussed above, the TCE 300 may be at least partially resident in the memory 140 of the computer system 100. The memory 140 may be coupled to the host bus 120 via memory controller 130. The host bus 120 may also be coupled to an input/output (I/O) bus 160, such as a Peripheral Component Interconnect (PCI) bus, PCI Express Bus, Universal Serial Bus (USB) or other bus, through a bus controller 150, such as a Southbridge chip. The bus controller 150 may be configured to manage bus access and to implement functions such as interrupts, bus arbitration, access channels, and direct memory access. A video display subsystem 170, coupled to a display 175, may be connected to the I/O bus 160. Similarly, a storage device 180, such as hard disk drive, a compact disk (CD) drive, Digital Video Disc (DVD) drive, Flash memory drive, or other type of device, may be coupled to the I/O bus 160. The storage device 180 is adapted to persistently store data, so that it may be loaded to the volatile memory 140 when needed. For example, the operating system 142 and the TCE 300 may be stored on storage device 180 until needed.

The I/O bus 160 may also be coupled to a network controller 185 that interfaces with a network 190. The network 190 may allow communication between the computer system 100 and other computer systems (not shown) using any of a number network protocols, such as Transmission Control Protocol (TCP), User Datagram Protocol (UDP), asynchronous transfer mode (ATM), or other types of network protocols. The network 190 may be a local area network (LAN), a wide area network (WAN) or another type of network that exchanges data via cabled links, for example copper conductors and/or optical fibers, or may be a wireless network, for example a Radio Frequency (RF) network.

While FIG. 1 shows the TCE 300 as resident in the memory 140 of the computer system 100 and executed locally on CPU 110, this does not preclude alternate remote, networked, and/or distributed computing arrangements. Such arrangements may make use of network 190 to allow some or all of the functionality of a TCE to be provided by other systems. In some configurations, a portion of the TCE 300 may still be resident in the memory 140 of the computer system 100. Yet, in other configurations the TCE 300 may not be present in the memory 140 of the computer system 100, and the computer system 100 may simply interface with a TCE 300 resident on a remote system.

Figure 2:
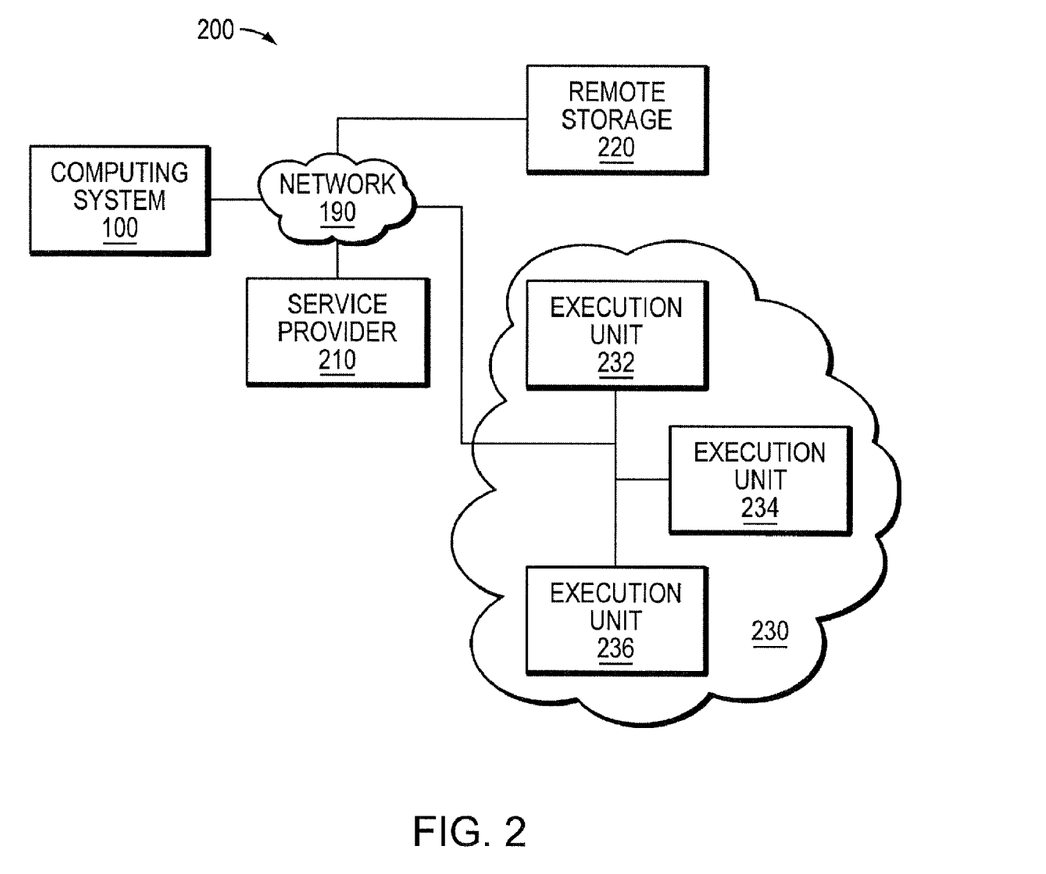
FIG. 2 is a high-level schematic block diagram of an example computer network that illustrates a number of remote, networked, and/or distributed computing arrangements.

FIG. 2 is a high-level schematic block diagram of a computer network 200 that illustrates a number of example remote, networked, and/or distributed computing arrangements. In one configuration, computer system 100 may communicate via network 190 with a service provider 210. A service provider 210 is an entity, such as an individual, a corporation, an educational institution, a government agency, or another type of organization that operates computing systems, such as servers, which may offer functionality to the computer system 100. For example, the service provider 210 may pass computer executable instructions to the computer system 100 that when executed by the computer system 100 perform a particular desired operation. Alternately, the service provider 210 may execute certain computer executable instructions on behalf of the computer system 100, and may pass computation results, display information, and/or other types of data back to the computer system 100.

In some embodiments, the service provider 210 may operate one or more web-servers configured to accept Hypertext Transfer Protocol (HTTP) and/or other types of requests from a web browser 148, or other application (not shown), of the computer system 100. A user of the computer system 100 may subscribe to web-based services provided by the service provider 210, for example via a monthly subscription, a per-use subscription, a data volume based subscription, a computational load-based subscription, or another type of subscription. Thereafter, the user may access, for example via their web browser 148, the functionality on a computer system of the service provider 210. For example, a user may be able to access a TCE and enter, test, and/or run text-based and/or graphical programs through their web-browser 148, in a similar manner as if a TCE 300 were resident locally. To provide such functionality, the service provider may offer the user access to one or more virtual environments that offer secure, isolated computing platforms to execute the users programs. By employing virtual environments a plurality of different users may share the resources of a computer system of the service provider 210, yet each interact with what appears to be a dedicated environment.

In another configuration, a remote storage system 220 may be provided that includes, for example, a Redundant Array of Independent Disks (RAID), an individual hard-disk drive, one or more solid state storage devices, and/or other types of storage devices. The remote storage system 220 may store information related to a collaborative project, for example a government or industry sponsored research or design project. Such information may include specifications, test data, program code, or other types of information. A user of the computer system 100 may obtain the information from the remote storage system 220, use, add to, or otherwise manipulate the information within a locally resident TCE 300, and then transfer information back to the remote storage system 220, for storage and possible use by others working on the project.

In another configuration, a cluster 230 of remote execution units 232, 234, 236, may be provided to perform remote processing on behalf of the computer system 100. The computer system 100 may offload certain computation tasks to one or more of the remote execution units 232, 234, 246, which perform the tasks and return results to the computer system 100. In this manner, additional computational resources beyond those of the computer system 100 may be enlisted when needed. In some implementations, the remote execution units may be configured to provide one or more virtual environment for executing the tasks.

Figure 3:
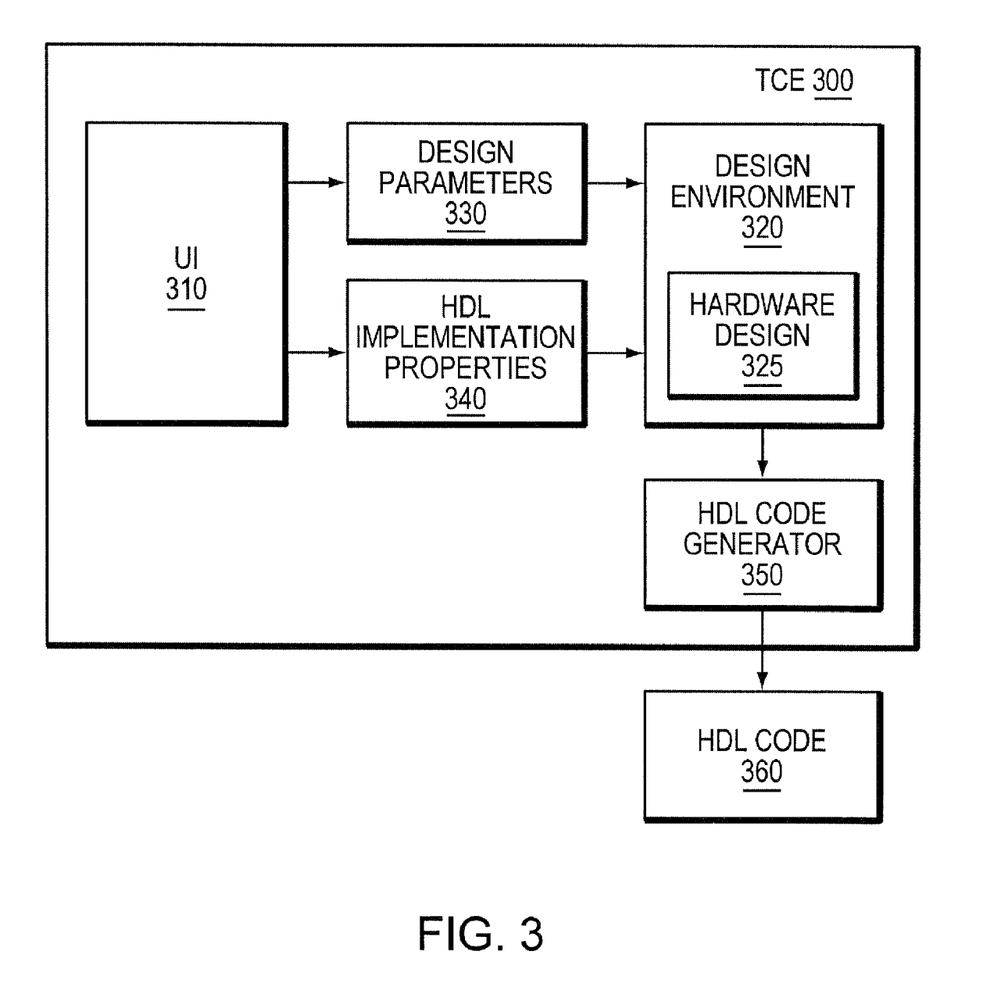
FIG. 3 is an expanded block diagram of an example Technical Computing Environment (TCE) that is capable of automatically generating HDL code.

FIG. 3 is an expanded block diagram of an example TCE 300 that is capable of automatically generating HDL code 360. The TCE 300 includes a user interface (UI) 310, which may be a graphical user interface (GUI), a command line interface (CLI), a hybrid interface including both GUI and CLI elements, and/or another type of interface. Such interface may be presented on the display 175 of the computer system. The UI 310 allows a user to enter information into a design environment 320 to create a hardware design 325. To create a hardware design 325, the user generally specifies a number of design parameters 330, which define the functionality of the hardware design 325. The design parameters 325 may indicate the hardware structures that should be included in the hardware design 325, their arrangement and interconnection, as well as specify a variety of other aspects of the hardware design. Depending on the particular TCE 300 employed, the way in which a user specifies the design parameters 330 may vary considerably. For example, design parameters 330 may be specified by the user making selections in dialog boxes, entering commands at a command prompt, including commands in text-based code, interconnecting and/or configuring graphical icons, as well as in a variety of other manners. Alternately, at least some design parameters 330 may be selected automatically. Depending on the particular hardware being designed, the exact nature of the design parameters 330 may vary considerably.

Figure 4:
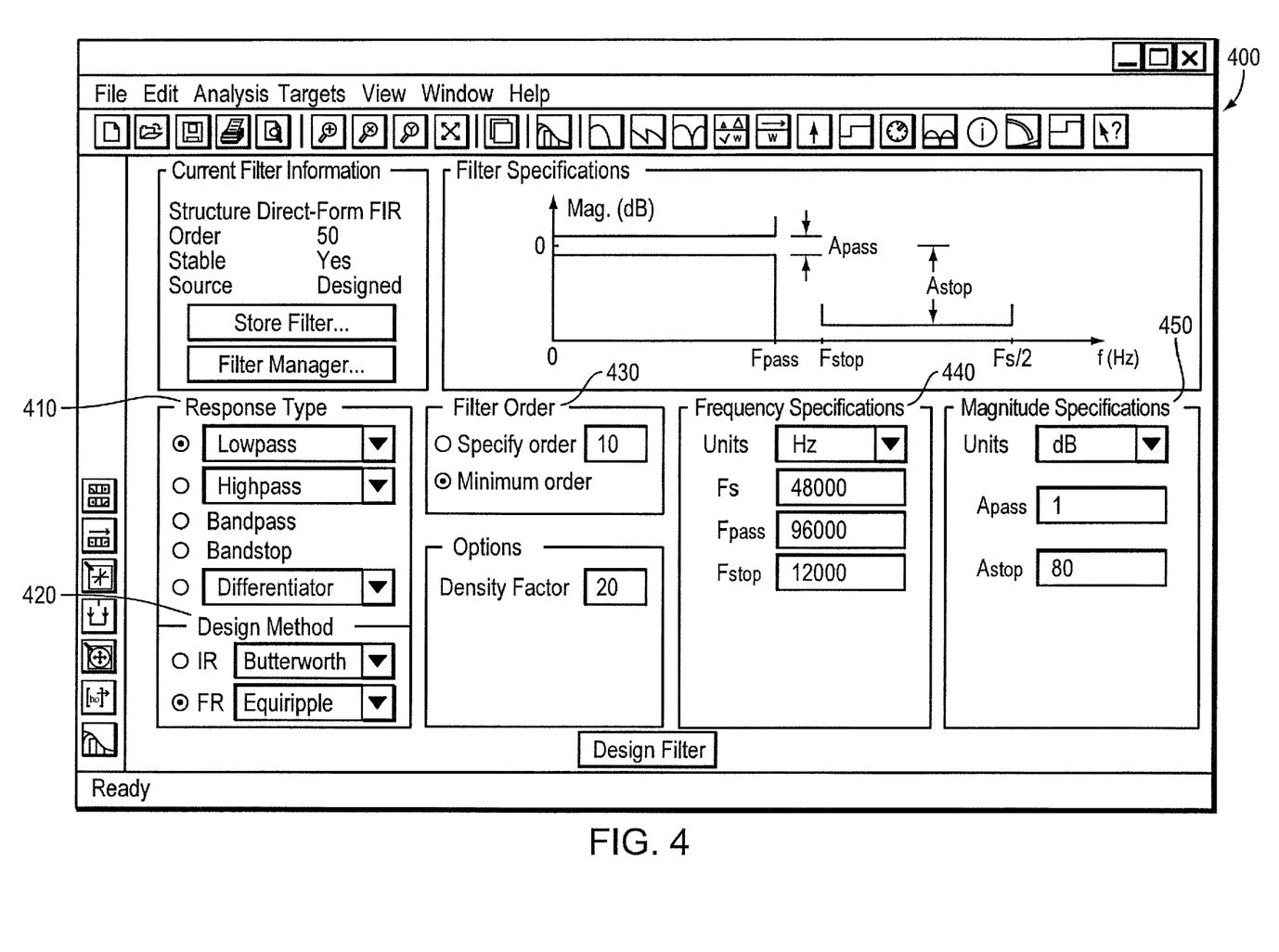
FIG. 4 is a first example dialog box that may be used in a user interface (UI) of the TCE to facilitate specification of design parameters.

For example, suppose the hardware design 325 describes a digital filter, such as a Finite Impulse Response (FIR) filter or an Infinite Impulse Response (IIR) filter. In this case, the user may specify design parameters 330 specifically applicable to digital filters. To illustrate, reference is made to FIG. 4, which is a first example dialog box 400 that may be used in UI 310 of the TCE 300 to facilitate specification of design parameters 330. By manipulating elements of the dialog box 400, the user may designate a response type 410, a design method 420, a filter order 430, frequency specifications 440, magnitude specifications 450 and/or a variety of other design parameters 330.

Returning to FIG. 3, in addition to specifying design parameters 330, the user may use the UI 310 to specify HDL implementation properties 340. HDL implementation properties 340 generally define how the functionality of a hardware design 325 is to be implemented in a hardware description, i.e., in HDL code. Depending on the particular TCE 300 employed, the way in which a user specifies HDL implementation properties 340 may vary considerably. For example, HDL implementation properties 340 may be specified by the user making selections in dialog boxes, entering commands at a command prompt, including commands in text-based code, interconnecting and/or configuring graphical icons, as well as in a variety of other manners. Similarly, depending on the TCE 300, the exact nature of the HDL implementation properties 340 may vary considerably.

Figure 5:
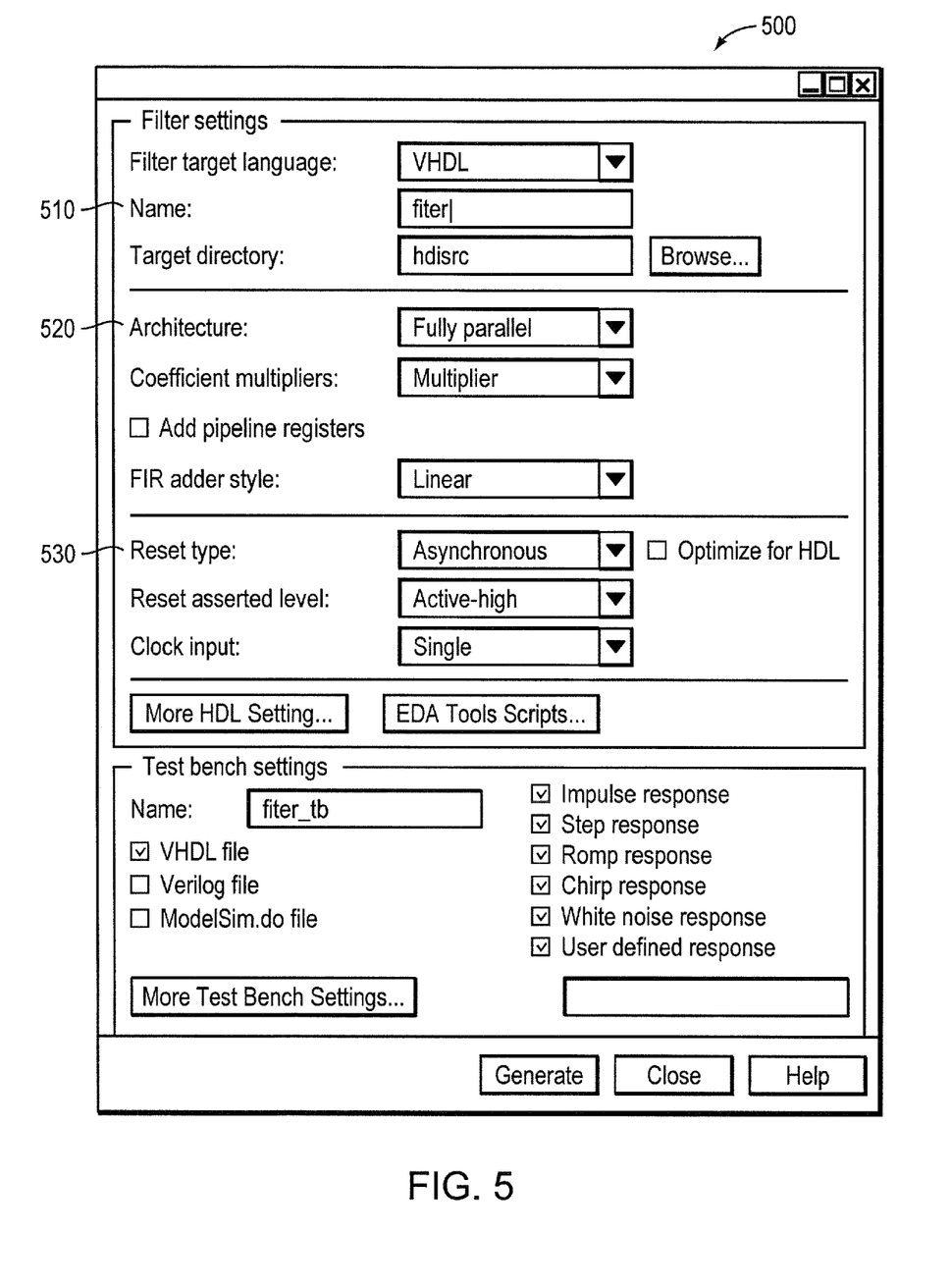
FIG. 5 is a second example dialog box that may be used in a UI of the TCE to facilitate specification of HDL implementation properties.

To illustrate, reference is made to FIG. 5, which is a second example dialog box 500 that may be used in the UI 310 of the TCE 300 to facilitate specification of HDL implementation properties 340. In this example, a user may manipulate elements of the dialog box 500 to designate a target HDL 510, an architecture 520, reset settings 530, as well as a number of other properties. In addition, a user may select, via additional elements (not shown), other properties such as clock and reset settings, input and output port settings, size constraints, and/or other types of properties 340.

Returning to FIG. 3, the hardware design 320 characterized by the design parameters 330 and HDL implementation properties 340, may be provided from the design environment 320 to a HDL code generator 350. The HDL code generator 350 may then generate HDL code 360, for example Verilog, VHDL and/or another type of HDL code therefrom. The reader is reminded that the term HDL as used herein should be interpreted broadly, and thus HDL code 360 may include HDL-like code, such as SystemVerilog, a synthesizable subset of SystemC, and/or other types of code, that may not technically be considered HDL yet offer similar or equivalent hardware design functionality.

In generating the HDL code 360, the HDL code generator 350 may instantiate one or more HDL modules, each of which may have an interface. An interface is a structure that includes input and/or output ports for passing signals between modules and/or other components. Depending on the particular embodiment, signals may represent data values, control values, logic levels, arrays, frames, complex values, waveforms or any of a variety of properties. While certain input or output ports may be individually specified by the user in creating the hardware design 325, the HDL code generator 350 may also automatically create a number of input and/or output ports for passing necessary signals. For example, the HDL code generator 350 may automatically create commonly present clock ports, clock enable ports, reset ports, flow-control ports, standardized data input and output ports, and/or a variety of other ports depending on the particular hardware design 325. In this manner, the HDL code generator 350 may automatically provide for certain routine interconnections, allowing the user to concentrate on higher-level design considerations.

Once generated, the HDL code 360 may be tested and/or simulated by a user. Further, if desired, the user may manually optimize and/or refine the HDL code 360. Thereafter, the HDL code 360 may be provided to a synthesis tool and synthesized into a gate-level netlist, which may be used to create a layout for creating or configuring a physical hardware device (not shown), for example an ASIC, FPGA, PAL, or other type of physical hardware device. Alternately, the HDL code 360 may be used to generate other HDL code.

In many hardware designs, at least one design parameter 330 may take the form of a numerical parameter. A numerical parameter is a value, coefficient, element of an enumeration, or other representation specified with a numeral in a hardware design 325. For example, supposing the hardware design 325 describes a digital filter, one or more numerical parameters may be used as coefficients of a transfer function of that filter. That is, one or more numerical parameters may be multiplied or otherwise combined with an input data signal to generate an output data signal of the digital filter. Alternately, one or more numerical parameters may be used as elements of an enumeration such as a set of integers. The numerical values that represent enumeration elements need not be adjacent. In other words, there may be unused numerical values between two numerical values that represent adjacent elements in an enumeration. Also, the enumeration may have a special element that could be represented by a numerical value with special properties such as 0 or 1.

Often, in prior art systems, all numerical parameters are "hard-coded" into generated HDL code. That is, any numerical parameters are simply defined in the generated HDL code using a data type associated with constants, for example with the parameter or localparameter constructs in Verilog, the constant construct in VHDL, or another similar construct. When HDL code with hard-coded numerical parameters is synthesized, the values of these numerical parameters generally become hardwired into any physical hardware device created and/or configured therefrom. While hard-coded numerical parameters are desirable in some circumstance, providing all parameters as hard-coded may be limiting in others. Accordingly, more flexible techniques, as discussed below, may benefit certain applications that use HDL.

Figure 6:
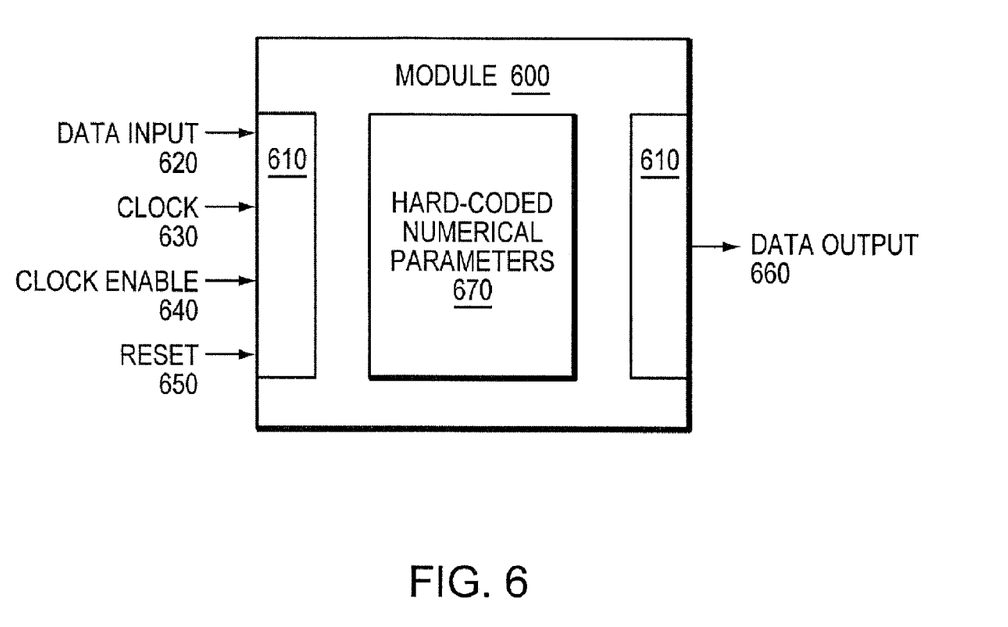
FIG. 6 is a block diagram of an example module that implements numerical parameters in a hard-coded manner.

FIG. 6 is a block diagram of an example module 600 that implements numerical parameters in a hard-coded manner. Such a module may have been generated by the HDL code generator 350. The module 600 includes an interface 610 configured to received a data input signal 620, a clock signal 630, a clock enable signal 640, and a reset signal 650. The interface 610 is further configured to pass a data output signal 660. Internal to the module 600, a number of hard-coded numerical parameters are maintained in structures 670.

To illustrate, suppose the module 600 represents a digital filter that utilizes the numerical parameters as coefficients of a transfer function. In such an example, the transfer function may operate upon samples of the received data input signal 620, and generate the data output signal 660. The use of hard-coded numerical parameters may allow for a variety of optimizations, as constant coefficients may obviate the need for some structures. For example, full arithmetic units that accept a full range inputs for each operand, such as full multipliers that accept a full range of inputs for each multiplicand, may not be required. Instead, more efficient constant coefficient arithmetic units, such as constant (K) coefficient multipliers (KCMs), which only accept a full range of inputs for one multiplicand, may be employed. In addition, a variety of other optimizations may be applied. Accordingly, in some situations, hard-coded numerical parameters may be preferable.

However, in other circumstances, more flexible and/or responsive behavior than what is attainable with hard-coded numerical parameters may be preferred. For example, in the case of a digital filter, it may be desirable to implement a dynamic transfer function or to provide for the filter to be reconfigurable. In other types of hardware devices, a variety of other factors may compel a user to prefer more flexible and/or responsive behavior. For example, it may be desirable to use flexible, reconfigurable hardware so that the same hardware may be used for two or more different operations, thereby saving chip area. Similarly, it may it may be desirable to tune numerical parameters after or during testing to improve performance of hardware, or to adjust numerical parameters to explore different design alternatives.

Accordingly, in one embodiment of the present disclosure, the user is provided with the ability to designate certain numerical parameters to be implemented as "tunable numerical parameters" in generated HDL code 360, while allowing other numerical parameters to be hard-coded into the generated HDL code 360. A tunable numerical parameter is a numerical parameter designated to be handled in a special way, so that its value may be set, adjusted, and/or dynamically changed in the hardware design. As described in more detail below, when a numerical parameter is designated to be a tunable numerical parameter, the HDL code generator 350 may instantiate a memory structure in the HDL code 360 for storing the numerical parameter, may instantiate one or more interface ports in the HDL code 360 for passing the value of the numerical parameter, and may instantiate certain structures internal to modules suitable for utilizing the numerical parameter and/or generating the appropriate control signals. By strategically designating some numerical parameters to be tunable numerical parameters, while allowing others to be hard-coded into the generated HDL code 360, a user may have greater control over how a design is implemented in HDL. Advantageously, this control is achieved absent manual HDL coding.

Figure 7:
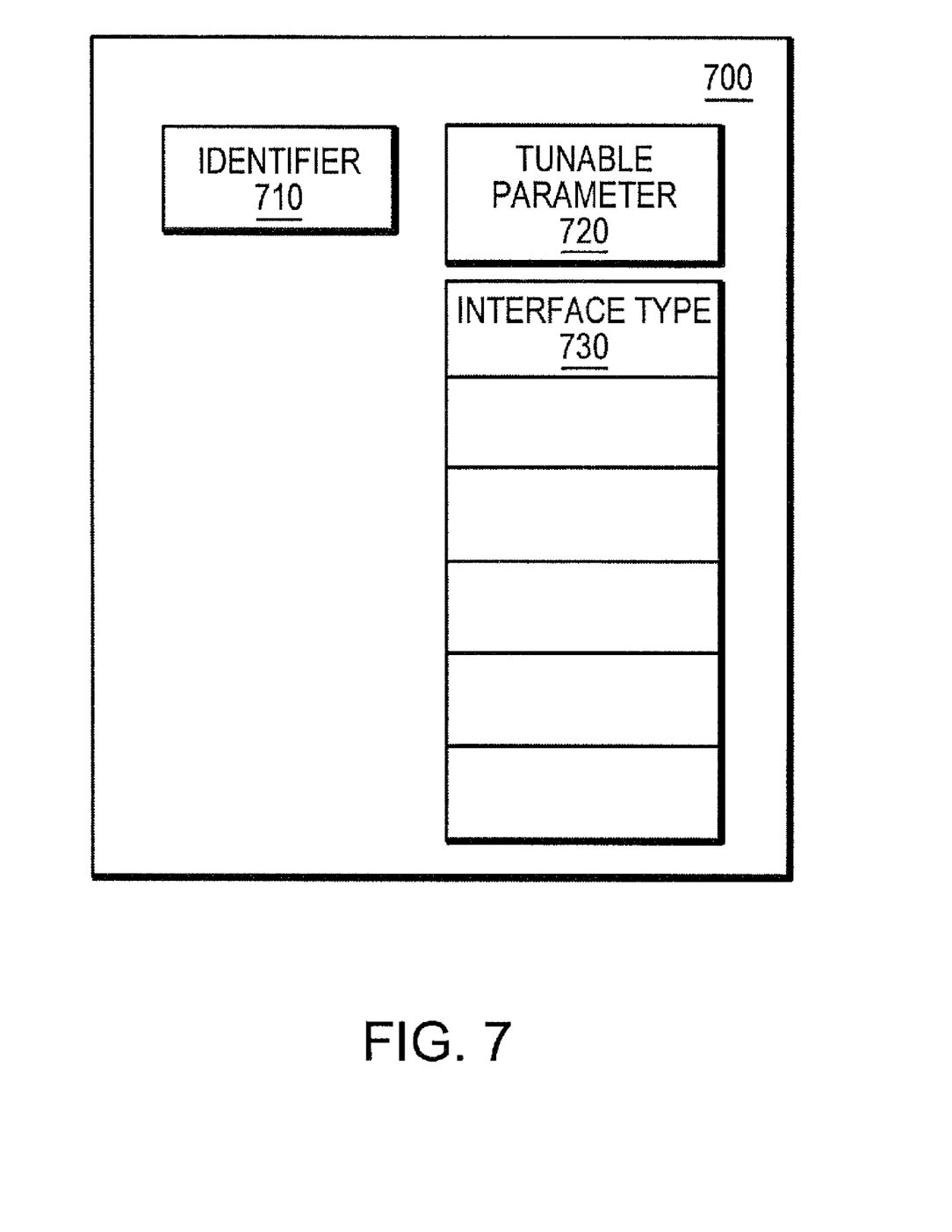
FIG. 7 is an example dialog box that may be used by the TCE to allow a user to designate one or more numerical parameters to be tunable numerical parameters.

A user may designate particular numerical parameters to be implemented as tunable via the UI 310 of the TCE 300. This selection may be performed in a variety of different manners depending on the particular TCE 300 employed. FIG. 7 is an example dialog box 700 that may be used by the TCE 300 to allow a user to select one or more numerical parameters to be tunable numerical parameters. A numerical parameter identifier 710 indicates, for example, by name, a particular numerical parameter. An associated tunable numerical parameter selection field 720 allows a user to indicate the parameter is desired to be tunable, for example via a check box, a drop down menu, or other input structure. Further, an interface selection field 730 may be provided to allow a user to select a particular type of interface to be used when the numerical parameter is passed. For example, the user may select a type of interface where data is transferred every clock cycle, where data is flow-controlled and transferred only at certain times, where data is transferred in particular units of data per clock cycle (for example, a serial data transfer), or a type of interface where data is transferred in some other manner. The interface selection field 730 may be a drop down menu, a text-entry field, or any of a variety of other structures capable of accepting user input.

While the dialog box 700 as shown in FIG. 7 may be used to advantage, it should be remembered that a numerical parameter may be designated as tunable in a variety of ways depending on the particular TCE 300 employed. For example, a text-based command may be provided that, when entered into the UI 310, indicates that a particular numerical parameters should be tunable. Alternately, a graphical programming block may be provided whose selection, configuration, and/or interconnection with other blocks may indicate a numerical parameter should be tunable. Accordingly, the present disclosure should be interpreted broadly to embrace a variety of such alternate techniques.

Figure 8:
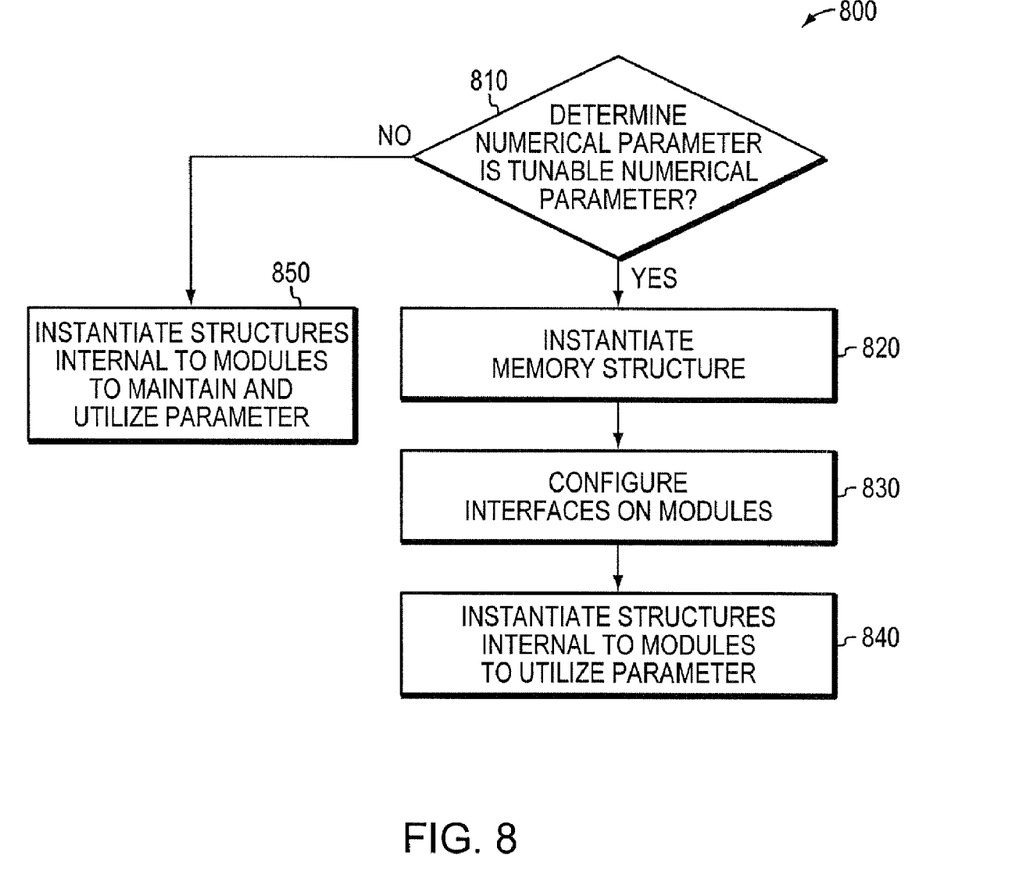
FIG. 8 is a flow diagram showing an example sequence of steps for automatically generating HDL code where numerical parameters may be tunable or hard coded.

FIG. 8 is a flow diagram showing an example sequence of steps for automatically generating HDL code 360, where numerical parameters may be tunable or hard coded. At step 810, the HDL code generator 350 determines whether a numerical parameter has been designated by a user as a tunable numerical parameter. Such a numerical parameter may be one of many numerical parameters in a hardware design 325.

If the numerical parameter has been designated by a user as a tunable numerical parameter, the HDL code generator 350, at step 820, instantiates in HDL code a memory structure for storing the numerical parameter. The memory structure may be a single-ported random access memory (RAM), a dual-ported RAM, a register file, or another type of memory structure. The HDL code generator may configure the HDL code to cause the memory structure to receive an initial value of the numerical parameter during initialization. This value may be maintained throughout operation, or may be updated or changed in response to signals during operation. For example, the memory structure may include appropriate ports for receiving a value of the numerical parameter from components internal to a module that includes the memory structure, from one or more other modules, from a microprocessor, from a non-volatile storage device, or from another source. In some configurations, the memory structure may include ports for receiving values for the numerical parameter from a component that uses the numerical parameter, to implement a feedback or other type of dynamic scheme.

At step 830, the HDL code generator 350 may configure the HDL code to provide interfaces and pathways for passing the numerical parameter. These may include a parameter input port for receiving a value of the tunable numerical parameter. They may also include one or more pathways for passing control signals back to the memory structure, for example, for passing read enable and address control signals back to the memory structure to facilitate reading of the numerical parameter from the memory structure. Further, in some configurations, pathways may be provided for passing data signals back to the memory structure to update the value of the tunable numerical parameter, for example as part of a feedback scheme.

At step 840, the HDL code generator 350 instantiates in HDL code certain other structures internal to the module to utilize the tunable numerical parameter. These structures may include additional and/or different hardware needed to utilize the tunable numerical parameter and to generate appropriate control and/or data signals. For example, full arithmetic units, such as full multipliers, may be instantiated in any modules that use the numerical parameter, to accommodate changes in the value of the numerical parameter. Likewise, control structures may be instantiated to generate the above discussed address and read enable signals and/or feedback or other types of signals for dynamic control.

Returning to step 810, if the numerical parameter has not been designated by a user as a tunable numerical parameter, the numerical parameter may be implemented in a hard-coded manner. At step 850, the code generator 350 instantiates in HDL code one or more structures internal to a module that uses the numerical parameter to both maintain and utilize the numerical parameter. For example, a constant coefficient arithmetic unit may be instantiated within the module that maintains the numerical parameter as a constant input to the unit and utilizes the numerical parameter in performing an arithmetic operation.

Figure 9:
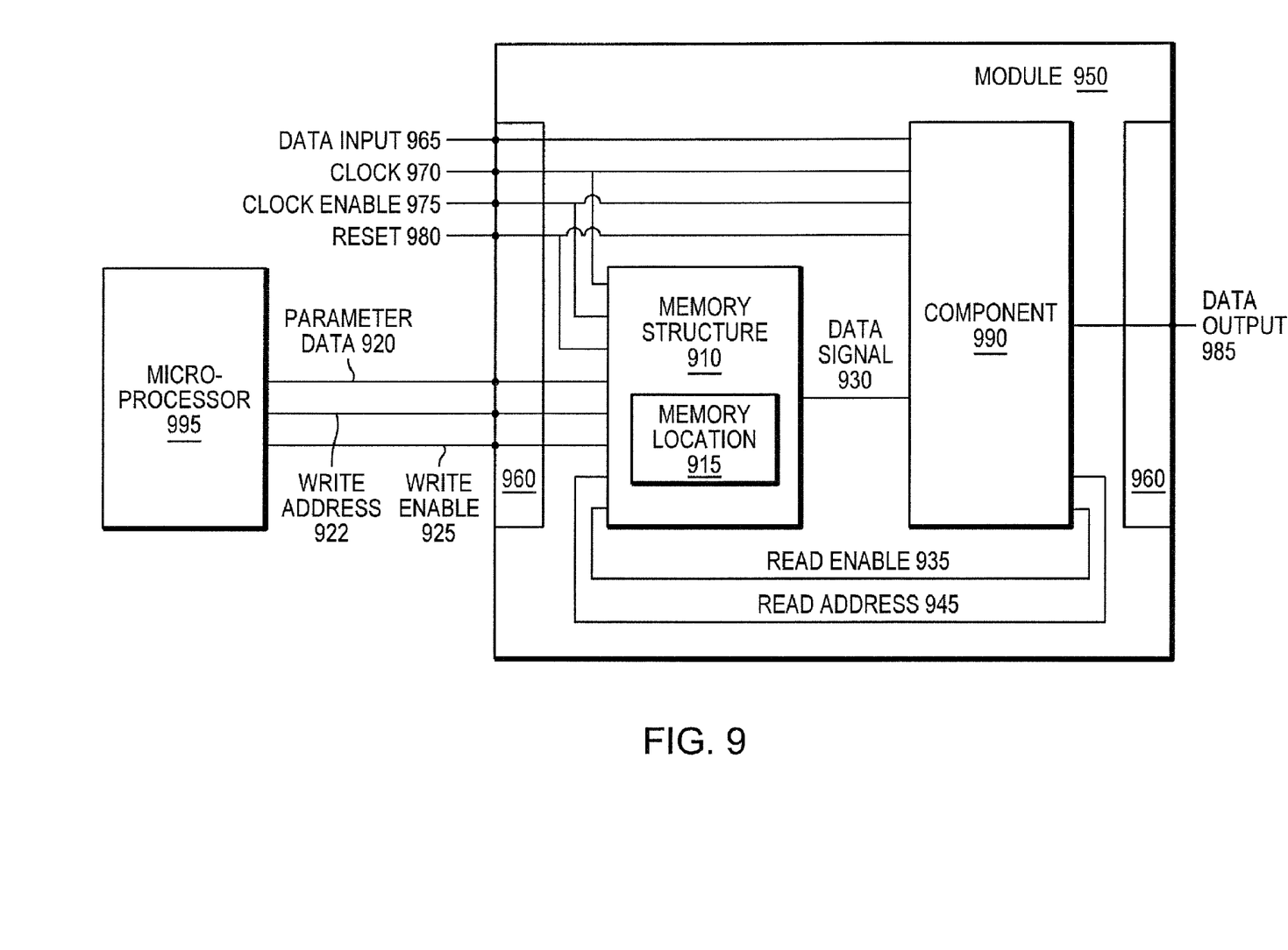
FIG. 9 is a block diagram of one example hardware arrangement that may be created by a HDL code generator applying the steps of FIG. 8.

FIG. 9 is a block diagram of one example hardware arrangement 900 that may be created by the HDL code generator 350 applying the steps of FIG. 8. Such a hardware arrangement represents but one arrangement that may be generated, and accordingly is included simply for illustrative purposes. The hardware configuration 900 includes a module 950 with an automatically generated memory structure 910, such as a RAM. The memory structure 910 includes a memory location 915 for storing a tunable numerical parameter. The memory structure 910 also includes a number of ports, for example, to receive a parameter data signal 920 indicating a value for the parameter, as well as a write address signal 922, a write enable signal 925, a clock signal 970, a clock enable signal 975, and a rest signal 980. The memory structure 910 further includes an automatically configured port for passing the numerical parameter as a data signal 930 to a component 990 of the module 950 that utilize the tunable numerical parameter. This signal may be sent in response to receiving a read enable signal 935 and an address signal 940 indicating the memory location 915 that stores the tunable numerical parameter.

The component 990 includes instantiated structures that utilize the tunable numerical parameter. To illustrate, suppose the module 950 implements a digital filter and the tunable numerical parameter is intended to be a coefficient of a transfer function. In such an example, the component 990 may implement the transfer function, and apply it to samples of the received data input signal 965 to generate the data output signal 985. In such a configuration, full arithmetic logic units, such as full multipliers, may be automatically instantiated in the component 990 to use the tunable numerical parameter provided from the memory structure 910. Alternately, if the module 950 implements another type of device, it may include other types of automatically instantiated internal structures or sub-modules to utilize the tunable numerical parameter.

The module 950 may include an expanded interface 960 that is automatically instantiated by the HDL code generator 350. The expanded interface 960 may include ports for receiving the data input signal 965, the clock signal 970, the clock enable signal 975, and the reset signal 980, as well as for passing the data output signal 985. The interface 960 may also include ports for receiving the parameter data signal 920, write address signal 922, and write enable signal 925 from an external device, for example a microprocessor 995.

The microprocessor 995 may assert the above discussed signals to write a value for the tunable numerical parameter to the memory location 915. Such a write operation may occur upon initialization, at a later time, or a number of later times, for example to dynamically change the value of the tunable numerical parameter in response to some factor. In this manner, highly flexible system may be implemented.

The foregoing has been a detailed description of several embodiments of the present disclosure. Further modifications and additions may be made without departing from the disclosure's intended spirit and scope.

For example, the code generator 350 may be further configured to generate HDL code for an automated test bench for exercising and testing the proper operation of tunable parameters in a module. When executed, the test bench may generate test stimuli and provide the test stimuli to ports of the module's interface. The automated test bench may monitor the data output from the module and/or may compare the output with expected results, to verify the correctness of the module. Alternately, the automated test bench may simply store the output for subsequent analysis or other use.

While the above description discusses the use of a TCE 300, the techniques described herein are in no way limited only to use only with a TCE 300. A variety of other environments may be used rather than a TCE. For example, the above techniques may be employed in a C programming environment, a C++ programming environment, a Java programming environment, or another type of environment.

Further, while the above description discusses selecting certain numerical parameters to be tunable and others to be hard-coded, with such selection applicable to all modules, the selection may alternately be made on a module-by-module basis. For example, a particular numerical parameter may be selected to be tunable with respect to a first module, but hard-coded with respect to a second module. In response, the HDL code generator 350 may instantiate a memory structure to store the numerical parameter in connection with the first module. The second module may instead rely upon a hard-coded version of the numerical parameter.

Further, while the above description discusses that a tunable numerical parameter has a single value at any particular time, this need not be the case. For example, in an alternate embodiment, a user may designate a parameter to be separately tunable for each structure that utilizes the numerical parameter. In response, to such a designation multiple memory structures may be instantiated to store values of the numerical parameter for use with different structures.

Further, while the above description discusses that a microprocessor may provide values for tunable numerical parameters, values may be provided in a variety of other manners. For example, the values may be provided from a computer system implementing a TCE that provides a graphical user interface allowing a user to set the values of tunable numerical parameters. These values may be received by a hardware device configured by the HDL code and used by the hardware device.

Further, while in some situations the values for tunable numerical parameters may be stored in a memory structure 910 located internal to the module 950, in some configurations the memory structure 910 may be located external to the module 950. Also, in other configurations, no memory structure 910 may be employed, and the values of the parameters simply passed as signals to the module 950.

Further, while the above description discusses the TCE 300 operating directly upon hardware of the computer system 300, in an alternate configuration the TCE 300 may operate on a virtualization layer that is employed on top of the underlying hardware. Such a virtualization layer may include a standardized application program interface (API) to be employed by applications running on the virtualization software stack.

Further, the reader is reminded that many of the above techniques may be implemented in hardware (for example in programmable logic circuits, specially-designed hardware chips, analog or partially-analog devices, and other types of devices), in software (for example in applications having computer-executable instructions stored on computer-readable media for execution on a computing device), or in a combination of hardware and software. Accordingly, it should be remembered that the above descriptions are meant to be taken only by way of example, and not restricted to a particular implementation mode.

What is claimed is:

1. An apparatus for automatically generating hardware description language (HDL) code, the apparatus comprising:
   a design environment configured to receive a hardware design for a hardware module, the hardware design including one or more numerical parameters;
   an interface configured to receive a designation of a first numerical parameter of one or more numerical parameters as a tunable numerical parameter, the tunable numerical parameter configured to allow value changes to the tunable numerical parameter during operation of the hardware module; and
   an HDL code generator configured to detect the designation of the first numerical parameter as a tunable numerical parameter and, in response, to instantiate a memory structure to store the first numerical parameter, to configure an interface of the module to receive a value of the first numerical parameter during operation of the hardware module, and to instantiate one or more structures internal to the module to utilize the first numerical parameter.

2. The apparatus of claim 1 wherein the HDL code generator is further configured to determine a second numerical parameter of the one or more numerical parameters has not been designated as a tunable numerical parameter, and to instantiate one or more structures to maintain the second numerical parameter as a hard-coded numerical parameter.

3. The apparatus of claim 2 wherein the one or more structures to maintain the second numerical parameter include a constant coefficient arithmetic unit configured to maintain the second numerical parameter as a constant input for an operand.

4. The apparatus of claim 1 wherein the interface includes a dialog box, the dialog box including an identifier that indicates the first numerical parameter and an associated field to accept the designation.

5. The apparatus of claim 1 wherein the memory structure is a random access memory (RAM) having a memory location to store the first numerical parameter.

6. The apparatus of claim 5 wherein the RAM is configured to provide the first numerical parameter in response to a read enable signal.

7. The apparatus of claim 1 wherein the HDL code generator is further configured to provide a port in the interface to receive the value for the first numerical parameter from an external device.

8. The apparatus of claim 7 wherein the external device is a microprocessor.

9. The apparatus of claim 1 wherein the HDL code includes a pathway for the memory structure to receive a value for the first numerical parameter from a component internal to the module.

10. The apparatus of claim 1 wherein the one or more structures internal to the module include a full arithmetic unit configured to accept a full range of inputs for each operand.

11. The apparatus of claim 1 wherein the interface is further configured to receive one or more HDL implementation properties, the HDL implementation properties including a target HDL.

12. The apparatus of claim 11 wherein the target HDL is an HDL selected from the group consisting of Verilog, VHDL a synthesizable subset of SystemC, and SystemVerilog.

13. The apparatus of claim 1 wherein the design environment, interface, and HDL code generator are part of a technical computing environment (TCE).

14. The apparatus of claim 1 wherein the module implements a digital filter.

15. The apparatus of claim 1 wherein the code generator is further configured to instantiate a second memory structure to store the first numerical parameter, the second memory structure to store a different value of the first numerical parameter for use with certain structures that utilize the first numerical parameter.

16. A method for automatically generating hardware description language (HDL) code, the method comprising:
receiving a hardware design for a hardware module, the hardware design including one or more numerical parameters;
detecting that a first numerical parameter of the one or more numerical parameters has been designated as a tunable numerical parameter, the tunable numerical parameter configured to allow value changes to the tunable numerical parameter during operation of the hardware module; and
in response to the step of detecting that the first numerical parameter has been designated, instantiating with HDL code a memory structure to store the first numerical parameter, configuring an interface of the module to receive a value of the first numerical parameter during operation of the hardware module, and instantiating with HDL code one or more structures internal to the module to utilize the first numerical parameter.

17. The method of claim 16, further comprising
detecting that a second numerical parameter has not been designated as a tunable numerical parameter; and
in response to the step of detecting that the second numerical parameter has not been designated, instantiating in HDL code one or more structures to maintain the second numerical parameter as a hard-coded numerical parameter.

18. The method of claim 16 further comprising:
designating, by a user, the first numerical parameter as a tunable numerical parameter.

19. The method of claim 16 further comprising:
creating a port in the interface, the port to receive the value for the first numerical parameter from an external device.

20. The method of claim 19 wherein the external device is a microprocessor.

21. The method of claim 16 further comprising:
creating a pathway for the memory structure to receive a value for the numerical parameter from a component internal to the module.

22. The method of claim 16 further comprising:
selecting one or more HDL implementation properties, the HDL implementation properties including a target HDL.

23. The method of claim 22 wherein the target HDL is an HDL selected from the group consisting of Verilog, VHDL, a synthesizable subset of SystemC, and SystemVerilog.

24. A computer-readable storage media comprising instructions for automatically generating hardware description language (HDL) code, the instructions, when executed by a processor, are operable to:
receive a hardware design for a hardware module, the hardware design including one or more numerical parameters;
detect, by the processor, that a first numerical parameter of the one or more numerical parameters has been designated as a tunable numerical parameter, the tunable numerical parameter configured to allow value changes to the tunable numerical parameter during operation of the hardware module;
instantiate, by the processor, with HDL code a memory structure to store the first numerical parameter;
configure, by the processor, an interface of the module to receive a value of the first numerical parameter during operation of the hardware module; and
instantiate, by the processor, with HDL code one or more structures internal to the module to utilize the first numerical parameter.

25. The computer-readable storage media of claim 24 wherein the instructions, when executed, are further operable to:
detect that a second numerical parameter has not been designated as a tunable numerical parameter; and
instantiate with HDL code one or more structures to maintain the second numerical parameter as a hard-coded numerical parameter.

26. The computer-readable storage media of claim 25 wherein the one or more structures to maintain the second parameter include a constant coefficient arithmetic unit configured to maintain the second numerical parameter as a constant input for an operand.

27. The computer-readable storage media of claim 24 wherein the memory structure is a random access memory (RAM) having a memory location to store the first numerical parameter.

28. The computer-readable storage media of claim 27 wherein the RAM is configured to provide the first numerical parameter in response to a read enable signal.

29. The computer-readable storage media of claim 24 wherein the instructions, when executed, are further operable to:
provide a port in the interface of the memory structure, the port to receive a value for the first numerical parameter from an external device.

30. The computer-readable storage media of claim 29 wherein the external device is a microprocessor.

31. The computer-readable storage media of claim 24 wherein the instructions, when executed, are further operable to:
provide a user interface (UI) to receive a designation from a user that the first numerical parameter designated is a tunable numerical parameter.

32. The computer-readable storage media of claim 24 wherein the instructions, when executed, are further operable to:
create a pathway for the memory structure to receive a value for the numerical parameter from a component internal to the module.

33. The computer-readable storage media of claim 24 wherein the one or more structures internal to the module include a full arithmetic unit configured to accept a full range of inputs for each operand.

34. The computer-readable storage media of claim 24 wherein the instructions, when executed, are further operable to:
receive a selection of one or more HDL implementation properties, the HDL implementation properties including a target HDL.

35. The computer-readable storage media of claim 24 wherein the target HDL is an HDL selected from the group consisting of Verilog, VHDL, a synthesizable subset of SystemC, and SystemVerilog.

36. The computer-readable storage media of claim 24 wherein the instructions, when executed, are further operable to:
instantiate a second memory structure to store the first numerical parameter, the second memory structure to store a different value of the first numerical parameter for use with certain structures that utilize the first numerical parameter.

37. The computer-readable storage media of claim 24 wherein the module implements a digital filter.

38. A computer-readable storage media comprising instructions for automatically generating hardware description language (HDL) code, the instructions, when executed by a processor, are operable to:
receive a hardware design for a hardware module, the hardware design including one or more numerical parameters;
detect, by the processor, that a first numerical parameter of the one or more numerical parameters has been designated as a tunable numerical parameter, the tunable numerical parameter configured to allow value changes to the tunable numerical parameter during operation of the hardware module;
configure, by the processor, an interface of the module to receive a value of the first numerical parameter during operation of the hardware module; and
instantiate, by the processor, with HDL code one or more structures internal to the module to utilize the first numerical parameter.

39. The computer-readable storage media of claim 38 wherein the instructions, when executed, are further operable to:
determine a second numerical parameter of the one or more numerical parameters has not been designated as a tunable numerical parameter; and
instantiate one or more structures to maintain the second numerical parameter as a hard-coded numerical parameter.

40. The computer-readable storage media of claim 39 wherein the one or more structures to maintain the second numerical parameter include a constant coefficient arithmetic unit configured to maintain the second numerical parameter as a constant input for an operand.

41. The computer-readable storage media of claim 38 wherein the HDL code is further configured to provide a port in the interface to receive the value for the first numerical parameter from an external device.

42. The computer-readable storage media of claim 38 wherein the HDL code is further configured to provide a pathway for the memory structure to receive a value for the first numerical parameter from a component internal to the module.

43. The computer-readable storage media of claim 38 wherein the instructions, when executed, are further operable to:
instantiate a second memory structure to store the first numerical parameter, the second memory structure to store a different value of the first numerical parameter for use with certain structures that utilize the first numerical parameter.

44. The computer-readable storage media of claim 38 wherein the instructions, when executed, are further operable to:
receive a new value of the first numerical parameter after one or more previous values of the first numerical parameter have been utilized by the one or more structures.

* * * * *